(12) United States Patent
Huang et al.

(10) Patent No.: US 7,816,068 B2
(45) Date of Patent: Oct. 19, 2010

(54) UNDERLAYER COMPOSITIONS CONTAINING HETEROCYCLIC AROMATIC STRUCTURES

(75) Inventors: Wu-Song S. Huang, Poughkeepsie, NY (US); Karen Temple, Toronto (CA); Pushkara R. Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 239 days.

(21) Appl. No.: 11/925,006

(22) Filed: Oct. 26, 2007

(65) Prior Publication Data

US 2008/0044776 A1 Feb. 21, 2008

Related U.S. Application Data

(62) Division of application No. 11/175,755, filed on Jul. 6, 2005, now Pat. No. 7,375,172.

(51) Int. Cl.
*G03F 7/00* (2006.01)
*G03F 7/004* (2006.01)
*G03F 7/40* (2006.01)
*G03F 7/11* (2006.01)

(52) U.S. Cl. .................. 430/270.1; 430/273.1; 430/311; 430/313; 430/317; 430/331

(58) Field of Classification Search ............ 430/270.1, 430/273.1, 905, 913, 311, 313, 317
See application file for complete search history.

(56) References Cited

U.S. PATENT DOCUMENTS

| | | | |
|---|---|---|---|
| 4,855,017 A | 8/1989 | Douglas | |
| 5,362,663 A | 11/1994 | Bronner et al. | |
| 5,429,710 A | 7/1995 | Akiba et al. | |
| 5,561,030 A | 10/1996 | Holdcroft et al. | |
| 5,562,801 A | 10/1996 | Nulty | |
| 5,618,751 A | 4/1997 | Golden et al. | |
| 5,744,376 A | 4/1998 | Chan et al. | |
| 5,801,094 A | 9/1998 | Yew et al. | |

(Continued)

FOREIGN PATENT DOCUMENTS

CA 1 204 547 5/1986

(Continued)

OTHER PUBLICATIONS

Machine translation of JP 2002-014474 (no date).*

(Continued)

*Primary Examiner*—Amanda C. Walke
(74) *Attorney, Agent, or Firm*—Scully, Scott, Murphy & Presser, P.C.; Ian D. MacKinnon, Esq.

(57) ABSTRACT

A composition suitable for use as a planarizing underlayer in a multilayer lithographic process is disclosed. The inventive composition comprises a polymer containing heterocyclic aromatic moieties. In another aspect, the composition further comprises an acid generator. In yet another aspect, the composition further comprises a crosslinker. The inventive compositions provide planarizing underlayers having outstanding optical, mechanical and etch selectivity properties. The present invention also encompasses lithographic structures containing the underlayers prepared from the compositions of the present invention, methods of making such lithographic structures, and methods of using such lithographic structures to pattern underlying material layers on a substrate.

5 Claims, 2 Drawing Sheets

U.S. PATENT DOCUMENTS

| | | | |
|---|---|---|---|
| 5,821,469 | A | 10/1998 | Shanmugham |
| 5,861,231 | A | 1/1999 | Barclay et al. |
| 5,886,102 | A | 3/1999 | Sinta et al. |
| 5,939,236 | A | 8/1999 | Pavelchek et al. |
| 5,948,570 | A | 9/1999 | Kornblit et al. |
| 5,962,184 | A | 10/1999 | Allen et al. |
| 6,037,097 | A | 3/2000 | Bucchignano et al. |
| 6,165,684 | A | 12/2000 | Mizutani et al. |
| 6,187,506 | B1 | 2/2001 | Ding et al. |
| 6,340,789 | B1 | 1/2002 | Petritsch et al. |
| 6,400,024 | B1 | 6/2002 | Drury et al. |
| 6,420,088 | B1 | 7/2002 | Angelopoulos et al. |
| 6,444,408 | B1 | 9/2002 | Brock et al. |
| 6,503,692 | B2 | 1/2003 | Angelopoulos et al. |
| 6,534,239 | B2 | 3/2003 | Varanasi et al. |
| 6,635,401 | B2 | 10/2003 | Li et al. |
| 6,686,124 | B1 | 2/2004 | Angelopoulos et al. |
| 6,730,454 | B2 | 5/2004 | Pfeiffer et al. |
| 6,800,566 | B2 | 10/2004 | Lu et al. |
| 6,818,381 | B2 | 11/2004 | Khojasteh et al. |
| 6,869,899 | B2 | 3/2005 | Mahorowala et al. |
| 6,949,325 | B2 | 9/2005 | Li et al. |
| 2005/0118749 | A1 | 6/2005 | Sakamoto et al. |
| 2005/0214674 | A1 | 9/2005 | Sui et al. |

FOREIGN PATENT DOCUMENTS

| | | |
|---|---|---|
| JP | 1-293339 | 11/1989 |
| JP | 2002014474 A * | 1/2002 |
| WO | WO03071357 A1 | 8/2003 |

OTHER PUBLICATIONS

U.S. Office Actions dated Nov. 15, 2007 and Mar. 30, 2010.

* cited by examiner

UNDERLAYER COMPOSITIONS CONTAINING HETEROCYCLIC AROMATIC STRUCTURES

RELATED APPLICATION

This application is a divisional application of U.S. patent application Ser. No. 11/175,755, filed Jul. 6, 2005.

FIELD OF INVENTION

The present invention relates to planarizing underlayer precursor compositions which are useful in multilayer lithographic processes. These underlayer precursor compositions provide underlayers having outstanding optical, mechanical and etch selectivity properties. The present invention also encompasses lithographic structures containing the underlayers prepared from the compositions of the present invention, methods of making such lithographic structures, and methods of using such lithographic structures to pattern underlying material layers on a substrate.

BACKGROUND OF THE INVENTION

In the microelectronics industry as well as in other industries involving construction of microscopic structures (e.g., micromachines, magnetoresistive heads, etc.), there is a continued desire to reduce the size of structural features. In the microelectronics industry, the desire is to reduce the size of microelectronic devices and/or to provide greater amount of circuitry for a given chip size.

Effective lithographic techniques are essential to achieving reduction of feature sizes. Lithography impacts the manufacture of microscopic structures not only in terms of directly imaging patterns on the desired substrate, but also in terms of making masks typically used in such imaging. Typical lithographic processes involve formation of a patterned resist layer by patternwise exposing the photoresist to an imaging radiation. The image is subsequently developed by contacting the exposed resist layer with a material (typically an aqueous alkaline developer) to selectively remove portions of the resist layer to reveal the desired pattern. The pattern is subsequently transferred to an underlying material by etching the material in openings of the patterned resist layer. After the transfer is complete, the remaining resist layer is then removed.

The resolution capability of lithographic processes is generally a function of the wavelength of imaging radiation, the quality of the optics in the exposure tool, and the thickness of the imaging layer. As the thickness of the imaging resist layer increases, the resolution capability decreases. Thinning of a conventional single layer resist to improve resolution generally compromises the etch resistance of the resist which is needed to transfer the desired image to the underlying material layer.

Furthermore, as the feature size of semiconductor devices decreases, critical dimension (CD) control becomes an important task. The "swing effect" (line width variation due to wafer surface topography and resist thickness variation) needs to be minimized during the lithographic process.

In order to obtain the resolution enhancement benefit of thinner imaging layers and reduce the swing effect in resists, multilayer lithographic processes (e.g., so-called bilayer and trilayer processes) have been developed. In bilayer lithographic processes, a so-called planarizing underlayer is used intermediately between the photoresist layer and the underlying material layer to be patterned. The underlayer receives the pattern from the patterned photoresist layer (typically a silicon-containing resist), and then the patterned underlayer acts as a mask for the etching process needed to transfer the pattern to the underlying material. In trilayer lithographic processes, a so-called interlayer (typically a silicon-containing composition) is used intermediately between the photoresist layer and the underlayer. The interlayer receives the pattern from the patterned photoresist layer, and then the patterned interlayer acts as a mask for etching the underlayer. The patterned underlayer then acts as a mask to transfer the pattern to the underlying material through etching, electroplating, metal deposition, ion implantation, or other semiconductor processing techniques.

The planarizing underlayer compositions should be sufficiently etchable selective to the overlying photoresist (to yield a good profile in the etched underlayer) while being resistant to the etch process needed to pattern the underlying material layer. Further, the planarizing underlayer composition should have the desired optical characteristics such as real index of refraction (n) which is the real part of refractive index, extinction coefficient (k) which is the imaginary part of refractive index, reflectivity, optical density, and etc., such that the need for any additional anti-reflective coating (ARC) layer is avoided. The planarizing underlayer composition should also have physical/chemical compatibility with the photoresist layer to avoid unwanted interactions which may cause footing and/or scumming. The typical thickness of the planarizing underlayer is very thin in order to fit the first minimum or second minimum in the reflective curve. Recently, many applications require a thick planarizing underlayer for etching. In this situation, the required k value of the ARC has to be reduced to a range similar to the traditional underlayer used in the bilayer resist system. The challenge of designing these types of underlayers for bilayer, single layer, and trilayer applications is to have desirable etch resistance towards an oxygen or nitrogen/hydrogen plasma, while having the k value in the range from about 0.12 to about 0.42.

Known underlayers for I-line and 248 nm DUV multilayer lithographic applications are typically based on novolac or polyhydroxystyrene polymers. However, these materials strongly absorb 193 nm lithographic applications. Thus, there is a continued need for improved compositions, especially compositions useful in lithographic processes using imaging radiation less than 200 nm (e.g., 193 nm) in wavelength.

U.S. Pat. No. 6,818,381 (hereinafter "the '381 patent") discloses planarizing underlayer precursor compositions comprising a polymer containing aromatic moieties such as phenyl and phenol groups as absorbing groups. Polymers containing aromatic moieties disclosed in the '381 patent provide absorbance to 193 nm wavelength. However, since the aromatic moieties such as phenyl and phenol have high absorption, only small amounts can be incorporated in the polymer structure, thus rendering the polymers less etch resistant and less likely to produce consistency. Further, the commonly used aromatic moieties in the polymer disclosed therein such as polystyrene and polyvinylphenol have k values too high to meet the requirement for the underlayer application. The preferred k value for underlayer is usually in the range from about 0.12 to about 0.42.

Thus, there remains a need for underlayer compositions that are compatible with typical photoresists and have desired optical properties so that the underlayer can also be used as an ARC.

SUMMARY OF THE INVENTION

Accordingly, the present invention is directed to a composition suitable for use as a planarizing underlayer in a multilayer lithographic process, wherein the composition comprises a polymer containing heterocyclic aromatic moieties. In another aspect, the composition of the present invention further comprises an acid generator. In yet another aspect, the composition of the present invention further comprises a crosslinker.

The acid generator is preferably a thermally activated acid generator. When the underlayer is to be used with a 157 nm lithographic process, the polymer preferably further includes fluorine moieties.

In another aspect, the present invention is directed to a lithographic structure on a substrate, the lithographic structure comprises a planarizing underlayer obtained by reacting an underlayer precursor composition of the present invention and a photoresist layer over the planarizing underlayer.

In another aspect, the present invention is directed to a method of forming a patterned material layer on a substrate, the method comprises: providing a substrate having a material layer on a surface thereof; forming a planarizing underlayer over the material layer, said planarizing underlayer is formed by reacting an underlayer precursor composition, wherein said underlayer precursor composition comprises a polymer containing heterocyclic aromatic moieties; depositing a photoresist composition on the substrate to form a photoresist layer on the planarizing underlayer; pattern-wise exposing portions of the photoresist layer to an imaging radiation; selectively removing the exposed portions of the photoresist layer to expose portions of the underlying planarizing underlayer; selectively removing the exposed portions of the planarizing underlayer to expose portions of the material layer, thereby forming a patterned planarizing underlayer on the material layer; and transferring the pattern in the planarizing underlayer to the material layer.

In another aspect, the present invention is directed to a method of forming a patterned material layer on a substrate, the method comprises: providing a substrate having a material layer on a surface thereof; forming a planarizing underlayer over the material layer, said planarizing underlayer is formed by reacting an underlayer precursor composition, wherein said underlayer precursor composition comprises a polymer containing heterocyclic aromatic moieties; forming an interlayer on the planarizing underlayer, wherein said interlayer comprises a silicon-containing material; depositing a photoresist composition on the substrate to form a photoresist layer on the interlayer; pattern-wise exposing portions of the photoresist layer to an imaging radiation; selectively removing the exposed portions of the photoresist layer to expose portions of the interlayer; selectively removing the exposed portions of the interlayer to expose portions of the planarizing underlayer; selectively removing the exposed portions of the planarizing underlayer to expose portions of the material layer; and etching the exposed portions of the material layer, thereby forming the patterned material feature.

DETAILED DESCRIPTION OF THE INVENTION

Figure 1:
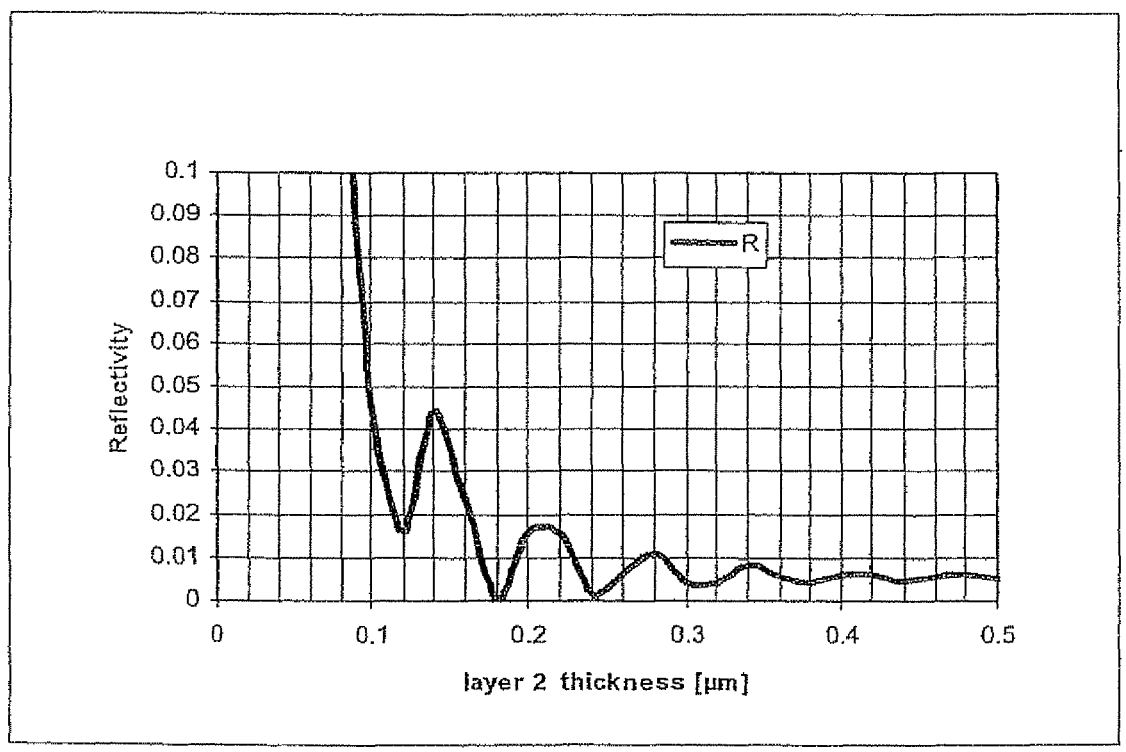
FIG. 1 is a graph plotting reflectivity (ratio) v. thickness (μm) illustrating the reflectivity of an inventive underlayer at various thickness.

In one aspect, the present invention is directed to an underlayer precursor composition suitable for formation of a planarizing underlayer, the underlayer precursor composition comprises a polymer containing heterocyclic aromatic moieties and an acid generator. In another aspect, the underlayer precursor composition of the present invention further comprises a crosslinker.

The heterocyclic aromatic moieties are preferably present in groups pending from monomers making up at least a portion of the backbone of the polymer. The phrase "heterocyclic aromatic moieties" as used herein denotes an organic group or molecule containing aromatic rings with at least one atom on the ring chosen from nitrogen, oxygen, or sulfur. The heterocyclic aromatic moieties may be non-fused heterocyclic aromatic rings (e.g., furan, pyrrole, thiophene, or thiazole) or fused heterocyclic aromatic rings (e.g., benzofuran, thianthrene, indazole, or quinazoline). Generally, the heterocyclic aromatic moieties are preferred to be non-fused heterocyclic aromatic rings. The more preferred non-fused heterocyclic aromatic rings are five, six, or seven-member rings. The heterocyclic aromatic moieties are preferably pendant from an ethylenic monomer.

In one preferred embodiment, the polymer of the present invention comprises a polyvinylthiophene monomer having the following structure:

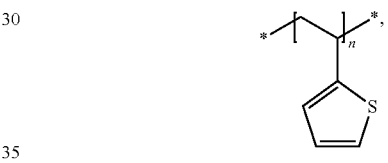

wherein n is an integer.

The compositions of the present invention preferably produce underlayers having an extinction coefficient (k) from about 0.08 to about 0.7, more preferably about 0.12 to about 0.42, and a real index of refraction (n) from about 1.3 to about 2.0, more preferably about 1.4 to about 1.8. For cyclic olefin or acrylate-based imaging layers, a k value of the underlayers from about 0.12 to about 0.42 reduces standing waves for contact or trench applications.

If the underlayer is to be used in a multilayer lithographic process using 157 nm imaging radiation, the polymer preferably contains a fluorine component. The fluorine component may be present as a pentafluoroaryl group such as perfluorostyrene, a trifluoromethyl group such as trifluoromethyacrylate, or in another form compatible with the other constituents of the planarizing layer composition and with the synthesis techniques used to form the polymer of the present invention.

The underlayer compositions of the present invention are preferably substantially free of silicon, especially where the photoresist layer is a silicon-containing resist.

The polymers of the present invention preferably have a weight average molecular weight, before any crosslinking reaction, from about 1000 to about 500,000, more preferably a weight average molecular weight from about 1500 to about 30,000.

The optical properties of the inventive polymer, such as real index of refraction (n) and extinction coefficient (k) can be tuned by incorporating other co-monomer units. Copolymerization of the inventive polymer containing heterocyclic aromatic moieties with different other aromatic and non-aromatic monomers can generate different n and k values, thus providing the flexibility in tuning the optical properties of the underlayer to match the optical properties of the overlying photoresist. Suitable co-monomer units for copolymerization of the inventive polymer include, but are not limited to: cyclic ether moieties, saturated polycyclic moieties, aromatic moieties, and other monomer units known in the art and compatible with other components of the underlayer composition. Examples of suitable cyclic ether monomers, saturated polycyclic monomers, and aromatic monomers are described in U.S. Pat. No. 6,818,381, the disclosure of which is herein incorporated by reference.

In two embodiments of the present invention, the copolymers have the following structures

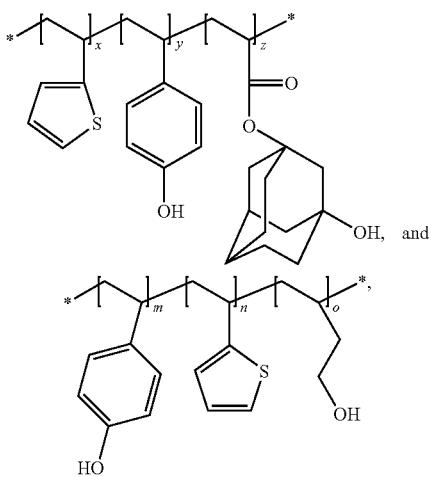

respectively, wherein x, y, z, m, n, and o are the same or different, and are integers.

The acid generator employed in the present invention is preferably an acid generator compound that liberates acid upon thermal treatment. A variety of known thermal acid generators are suitably employed such as, 2,4,4,6-tetrabromocyclohexadienone, benzoin tosylate, 2-nitrobenzyl tosylate and other alkyl esters of organic sulfonic acids. Compounds that generate a sulfonic acid upon activation are generally suitable. Other suitable thermally activated acid generators are described in U.S. Pat. Nos. 5,886,102 and 5,939,236, the disclosures of which are incorporated herein by reference.

If desired, a radiation-sensitive acid generator may be employed as an alternative to a thermally activated acid generator or in combination with a thermally activated acid generator. Examples of suitable radiation-sensitive acid generators are described in U.S. Pat. Nos. 5,886,102 and 5,939,236. Other radiation-sensitive acid generators known in the art may also be used as long as they are compatible with the other components of the planarizing underlayer composition. When a radiation-sensitive acid generator is used, the cure (crosslinking) temperature of the composition may be reduced by application of appropriate radiation to induce acid generation which, in turn, catalyzes the crosslinking reaction. Even if a radiation-sensitive acid generator is used, it is preferred to thermally treat the composition to accelerate the crosslinking process (e.g., for wafers in a production line).

If desired, the compositions of the present invention may contain a separate crosslinking component that can be reacted with the underlayer polymer in a manner which is catalyzed by the generated acid and/or by heating. Generally, the crosslinking component used in the underlayer compositions of the present invention may be any suitable crosslinking agent known in the art which is otherwise compatible with the other selected components of the composition. The crosslinking agents preferably act to crosslink the polymer component in the presence of a generated acid. Preferred crosslinking agents are glycoluril compounds available under the Powderlink® trademark from American Cyanamid Company. Other possible crosslinking agents include 2,6-bis(hydroxymethyl)-p-cresol and compounds disclosed in Japanese Laid-Open Patent Application (Kokai) No. 1-293339, as well as etherified amino resins disclosed in Canadian Patent No. 1 204 547. Other crosslinking agents such as bis-epoxies or bis-phenols may also be used. Combinations of the above-mentioned crosslinking agents may also be used.

The compositions of the invention preferably contain, on a solids basis, about 50-98 wt. % of the polymer, more preferably about 70-80 wt. % of the polymer; about 0-50 wt. % of an optional crosslinking component; and about 0-20 wt. % acid generator, more preferably about 1-15 wt. %.

The compositions of the present invention may be used in combination with any desired resist material in forming a lithographic structure. Preferably, the resist is imagable with ultraviolet radiation (e.g., <400 nm wavelength) or with electron beam radiation. Examples of suitable resist materials are described in U.S. Pat. Nos. 5,861,231, 5,962,184, and 6,037,097, the disclosures of which are incorporated herein by reference. A preferred resist for bilayer applications using 193 nm radiation is disclosed in U.S. Pat. No. 6,444,408, the disclosure of which is incorporated herein by reference.

The compositions of the present invention typically contain a solvent prior to their application to the desired substrate. The solvent may be any solvent conventionally used with resists which otherwise do not have any excessively adverse impact on the performance of the underlayer composition. Preferred solvents are propylene glycol monomethyl ether acetate or cyclohexanone. The amount of solvent in the composition for application to a substrate is preferably sufficient to achieve a solids content of about 5 to about 20 wt. %. Higher solids content formulations will generally yield thicker coating layers. The compositions of the invention may further contain minor amounts of auxiliary components (e.g., surfactants, dyes, etc.) as is known in the art.

In another aspect, the present invention is directed to a lithographic structure on a substrate, the lithographic structure comprises a planarizing underlayer layer obtained by reacting an underlayer precursor composition of the present invention and a photoresist layer over the planarizing underlayer layer. The compositions of the present invention can be prepared by combining the polymer, acid generator, and any other desired ingredients using conventional methods. The compositions of the present invention advantageously may be formed into planarizing underlayers on a substrate by spin-coating followed by baking to achieve crosslinking and solvent removal. The baking is preferably conducted at about 250° C. or less, more preferably about 110° C. to about 230° C. The baking time may be varied depending on the layer thickness and bake temperature. A typical time at 215° C. would be about two minutes.

The thickness of the planarizing underlayer composition of the present invention may vary depending on the underlying topography and the intended etch protocol for etching the material layer to be patterned. The thickness is preferably about 0.1 to about 5 μm.

In one embodiment of the present invention, polyvinylthiophene was formulated with 8 wt. % Powerlink® and 4 wt. % I-PFBUS in PGMEA to afford a 10% (wt./vol.) aqueous polymer solution. The resulting solution was then spin coated with 2500 rpm on a silicon wafer forming a coated substrate. Next, the resulting coated substrate was baked at 215° C. for 120 seconds forming a planarizing underlayer. FIG. 1 is a reflectance curve of a substrate using this planarizing underlayer beneath a bilayer resist with n value of 1.65 and k value of 0.02 demonstrating the reflectivity below 1%. The measured n and k values of the inventive underlayer having a thickness of 210 nm at 193 nm are 1.4744 and 0.1696, respectively. The n and k values of this inventive polymer can be further tuned through copolymerization of the polyvinylthiophene monomer with polyvinylphenol or polystyrene monomer units.

Figure 2:
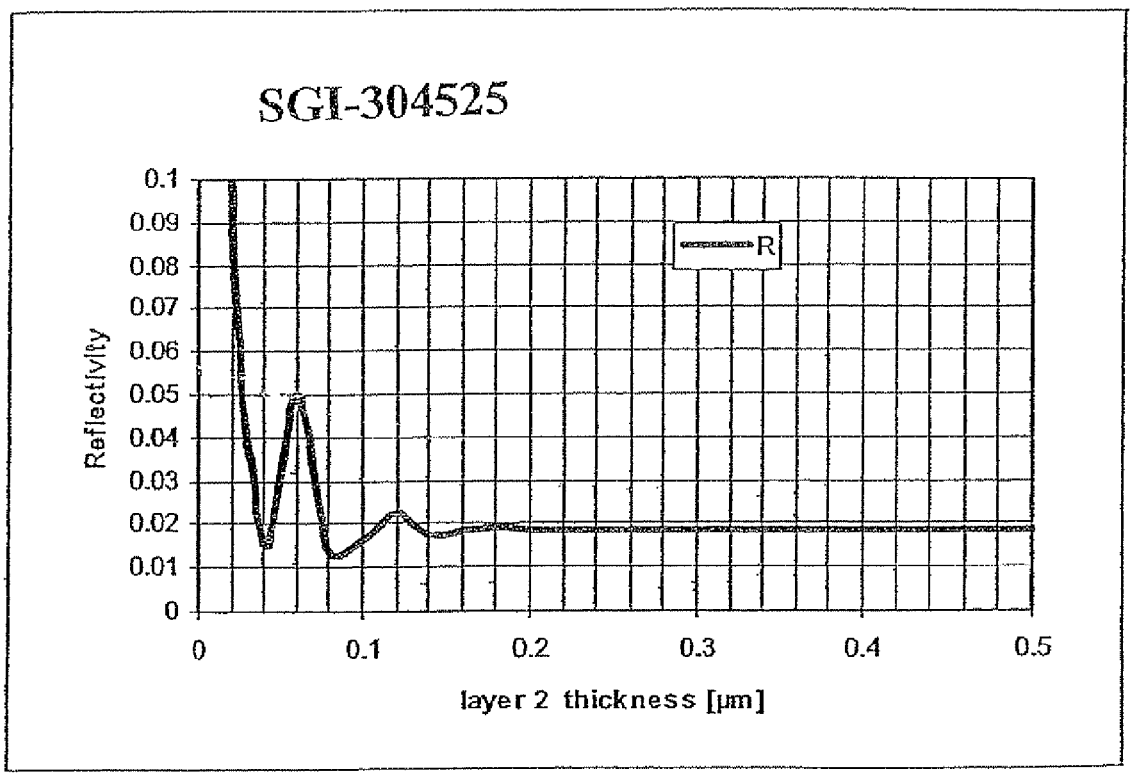
FIG. 2 is a graph plotting reflectivity (ratio) v. thickness (μm) illustrating the reflectivity of a prior art SGI-304525 underlayer at various thickness.

In contrast, FIG. 2 is a reflectance curve of substrate using a planarizing underlayer comprising a prior art polymer (SGI-304525) disclosed by the '381 patent and reproduced herein below. FIG. 2 shows the reflectivity around 2% with this underlayer under a bilayer resist with n value of 1.65 and k value of 0.02. The measured n and k values of the prior art underlayer at 193 nm are about 1.73 and about 0.43, respectively.

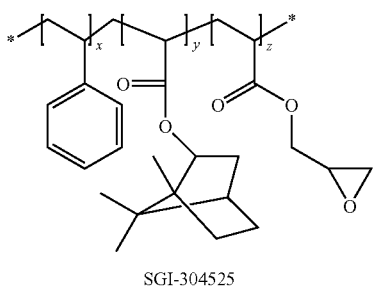

SGI-304525 wherein x, y, and z are integers, and are in the ratio of X:Y:Z=3:5:2.

In view of FIG. 1 and FIG. 2, the inventive underlayer has a reduced and more desirable reflectivity.

The compositions of the present invention are especially useful for lithographic processes used in the manufacture of integrated circuits on semiconductor substrates. The compositions are especially useful for lithographic processes using 193 nm or shorter wavelength UV imaging radiation.

The compositions of the present invention may be used in a method of forming a patterned material layer on a substrate. In such a method, the material layer may be, for example, a ceramic, dielectric, conductor or semiconductor layer, such as those used in the manufacture of high performance integrated circuit devices and associated chip carrier packages.

In a bilayer process, the composition of the present invention is preferably applied directly over the material layer to be patterned, preferably by spin-coating. The composition is then baked to remove solvent and cured (crosslinked). The underlayer compositions of the present invention can be prepared by combining the polymer, acid generator, and any other desired ingredients using conventional methods. The compositions of the present invention advantageously may be formed into planarizing underlayers on a substrate by spin-coating followed by baking to achieve crosslinking and solvent removal. The baking is preferably conducted at about 250° C. or less, more preferably about 110° C. to about 230° C. The baking time may vary depending on the layer thickness and bake temperature. A typical time at 215° C. would be about two minutes. A typical planarizing underlayer thickness is about 100 to about 5000 nm.

Next, a photoresist composition is deposited on the substrate by known means, to form a photoresist layer on the material. The substrate with the photoresist layer is then baked (post-apply bake, herein after "PAB") to remove any solvent from the photoresist composition and improve the coherence of the photoresist layer. Typical PAB baking temperatures are about 80° to about 150° C. The PAB step is preferably conducted for about 10 seconds to about 15 minutes, more preferably about 15 seconds to about one minute. The PAB temperature may vary depending on the glass transition temperature of the photoresist. A typical photoresist thickness is from about 50 to about 800 nm. Any suitable resist composition may be used, such as the resist composition disclosed in U.S. Pat. Nos. 6,534,239 and 6,635,401 B2, and U.S. patent application Ser. No. 10/663,553, filed Sep. 16, 2003, the disclosures of which are incorporated herein by reference.

After solvent removal, the photoresist layer is then exposed to an appropriate radiation source through a patterned mask. In one exemplary embodiment, the imaging radiation is 193 nm radiation. In another embodiment, the imaging radiation is 157 nm radiation. In another embodiment, the imaging radiation is 248 nm radiation. The exposed substrate may then be baked (post-exposure bake) to complete the acid-catalyzed reaction and to enhance the contrast of the exposed pattern. The post-exposure baking temperature is determined by the properties of the photoresist. The post-exposure bake is preferably conducted at about 60° C. to about 175° C., more preferably about 90° C. to about 160° C. The post-exposure bake is preferably conducted for about 30 seconds to about 5 minutes. Those ordinarily skilled in the art can ascertain the necessary conditions without undue experimentations.

The exposed substrate is then contacted with an aqueous base solution (developer), thereby selectively removing the exposed portion of the photoresist layer and forming a patterned photoresist layer on the material layer with portions of the planarizing underlayer exposed. The aqueous base solution is preferably an aqueous alkaline developer, more preferably an aqueous solution of tetramethyl ammonium hydroxide. The resulting lithographic structure is then typically dried to remove any remaining developer solvent.

The pattern in the photoresist layer may then be transferred to the exposed portions of the planarizing underlayer of the present invention by reactive ion etching or other suitable etch techniques known in the art.

After the patterning of the planarizing underlayer of the present invention, the underlying material layer to be patterned is then etched using an etchant appropriate to the material layer composition. Typically, the pattern in the planarizing underlayer may be transferred to the exposed portions of the material layer of the present invention by reactive ion etching or other suitable etch techniques known in the art. Alternatively, exposed portions of the material may be subjected to electroplating, metal deposition, ion implantation, or other semiconductor processing techniques. The method of the present invention may be used to create patterned material layer structures, such as metal wiring lines, holes for contacts or vias, insulation sections (e.g., damascene trenches or shallow trench isolation), trenches for capacitor structures, etc. as might be used in the design of integrated circuit devices.

The processes to make these (ceramic, dielectric, conductor or semiconductor) features generally involve providing a material layer or section of the substrate to be patterned, applying a layer of photoresist over the material layer or section, applying a top coat layer on the layer of photoresist, pattern-wise exposing the top coat and photoresist layers to radiation, post-exposure baking the exposed resist, developing the pattern by contacting the exposed top coat and photoresist with a developer, etching the layer(s) underlying the photoresist layer at spaces in the pattern whereby a patterned material layer or substrate is formed, and removing any remaining photoresist from the substrate. In some instances, a hard mask may be used below the photoresist layer to facilitate transfer of the pattern to a further underlying material layer or section. It should be understood that the invention is not limited to any specific lithography technique or device structure.

In a trilayer process, the inventive composition is preferably applied directly to the surface of the substrate, using a suitable deposition process, such as spin-on coating. The composition is then baked to remove solvent and cured (crosslinked). The underlayer compositions of the present invention can be prepared by combining the polymer, acid generator, and any other desired ingredients using conventional methods. The compositions of the present invention advantageously may be formed into planarizing underlayers on a substrate by spin-coating followed by baking to achieve crosslinking and solvent removal. The baking is preferably conducted at about 250° C. or less, more preferably about 110° C. to about 230° C. The baking time may vary depending on the layer thickness and bake temperature. A typical time at 215° C. would be about two minutes. The planarizing underlayer preferably has a thickness of about 80 to about 8000 nm.

Then, an interlayer, which typically comprises a silicon-containing material, is applied to the upper surface of the underlayer utilizing a conventional deposition process, such as spin-on coating, evaporation, chemical vapor deposition, plasma-assisted chemical vapor deposition, and physical vapor deposition. The thickness of the interlayer is preferably about 10 to about 500 nm, more preferably about 20 to about 200 nm. The interlayer may comprise a silicon-containing material, such as polysiloxane, polysilane, silylated novolac, Si doped PMMA, silicon-polyimide, and/or polyvinylsilylsulfone. Suitable interlayer materials are the silicon containing spin on ARC/hardmask materials described, for example, in U.S. Pat. Nos. 6,420,088; 6,503,692; and 6,730,454.

Next, a photoresist composition is deposited on the substrate by known means to form a photoresist layer on the material. The substrate with the photoresist layer is then baked (post-apply bake, herein after "PAB") to remove any solvent from the photoresist composition and improve the coherence of the photoresist layer.

After solvent removal, the photoresist layer is exposed to an appropriate radiation source through a patterned mask. The exposed substrate is then contacted with an aqueous base solution (developer), thereby selectively removing the exposed portion of the photoresist layer and forming a patterned photoresist layer on the material layer with portions of the interlayer exposed.

The pattern in the photoresist layer may then be transferred to the exposed portions of the interlayer of the present invention by reactive ion etching or other suitable etch techniques known in the art. Next, the pattern in the interlayer is transferred to the exposed portions of the planarizing underlayer of the present invention by reactive ion etching or other suitable etch techniques known in the art.

After the patterning of the planarizing underlayer of the present invention, the underlying material layer to be patterned is then etched using an etchant appropriate to the material layer composition.

Examples of lithographic processes where the composition of the present invention may be useful are disclosed in U.S. Pat. Nos. 4,855,017, 5,362,663, 5,429,710, 5,562,801, 5,618,751, 5,744,376, 5,801,094, 5,821,469, and 5,948,570, the disclosures of which are incorporated herein by reference. It should be understood that the invention is not limited to any specific lithography technique or device structure.

Having thus described our invention in detail, what we claim as new and desire to secure by the Letters Patent is:

1. A method of forming a patterned material layer on a substrate, the method comprising:
   providing a substrate having a material layer on a surface thereof;
   forming a planarizing underlayer over the material layer, said planarizing underlayer is formed by reacting an underlayer precursor composition, wherein said underlayer precursor composition comprises a polymer containing a monomer unit having the following structure:

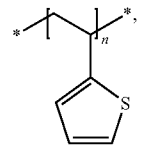

wherein n is an integer;
   depositing a photoresist composition on the substrate to form a photoresist layer on the planarizing underlayer;
   pattern-wise exposing portions of the photoresist layer to an imaging radiation;
   selectively removing the exposed portions of the photoresist layer to expose portions of the underlying planarizing underlayer;
   selectively removing the exposed portions of the planarizing underlayer to expose portions of the material layer, thereby forming a patterned planarizing underlayer on the material layer; and
   transferring the pattern in the planarizing underlayer to the material layer.

2. A method of forming a patterned material feature on a substrate, said method comprising:
   providing a substrate having a material layer on a surface thereof;
   forming a planarizing underlayer over the material layer, said planarizing underlayer is formed by reacting an underlayer precursor composition, wherein said underlayer precursor composition comprises a polymer containing a monomer unit having the following structure:

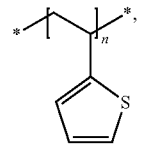

wherein n is an integer;
   forming an interlayer on the planarizing underlayer, wherein said interlayer comprises a silicon-containing material;
   depositing a photoresist composition on the substrate to form a photoresist layer on the interlayer;
   pattern-wise exposing portions of the photoresist layer to an imaging radiation;
   selectively removing the exposed portions of the photoresist layer to expose portions of the interlayer;
   selectively removing the exposed portions of the interlayer to expose portions of the planarizing underlayer;
   selectively removing the exposed portions of the planarizing underlayer to expose portions of the material layer; and
   etching the exposed portions of the material layer, thereby forming the patterned material feature.

3. The method of claim 2, wherein said interlayer comprises a material selected from the group consisting of polysiloxane, polysilane, silylated novolak, silicon-doped PMMA, silicon-polyimide, and polyvinylsilylsulfone.

4. The method of claim 2, wherein said underlayer precursor composition further comprises an acid generator.

5. A method of forming a patterned material layer on a substrate, the method comprising:

provilding a substrate having a material layer on a surface thereof;

forming a planarizing underlayer over the material layer, said planarizing underlayer is formed by reacting an underlayer precursor composition, wherein said underlayer precursor composition comprises an acid generator and a polymer containing a monomer unit having the following structure:

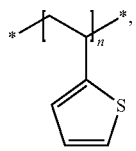

wherein n is an integer;

depositing a photoresist composition on the substrate to form a photoresist layer on the planarizing underlayer;

pattern-wise exposing portions of the photoresist layer to an imaging radiation;

selectively removing the exposed portions of the photoresist layer to expose portions of the underlying planarizing underlayer;

selectively removing the exposed portions of the planarizing underlayer to expose portions of the material layer, thereby forming a patterned planarizing underlayer on the material layer; and transferring the pattern in the planarizing underlayer to the material layer.

* * * * *